United States Patent
Bell et al.

[11] Patent Number: 5,951,791
[45] Date of Patent: Sep. 14, 1999

[54] METHOD OF PREPARING POROUS NICKEL-ALUMINUM STRUCTURES

[75] Inventors: James Alexander Evert Bell, Oakville; Kirt Kenneth Cushnie, Burlington; Anthony Edward Moline Warner, Burlington, all of Canada; George Clayton Hansen, Midway, Utah; Raymond Augustus Bradford, Woodbridge, Canada

[73] Assignee: Inco Limited, Toronto, Canada

[21] Appl. No.: 08/980,495

[22] Filed: Dec. 1, 1997

[51] Int. Cl.⁶ .................................................. B22F 7/02
[52] U.S. Cl. ........................... 148/518; 148/535; 75/362; 419/2; 419/8
[58] Field of Search .............................. 419/2, 8; 75/362; 148/518, 535, 537

[56] References Cited

U.S. PATENT DOCUMENTS

| | | | |
|---|---|---|---|
| 3,679,552 | 7/1972 | Jervis | 204/37 R |
| 3,946,039 | 3/1976 | Walz | 419/2 |
| 4,362,647 | 12/1982 | Torigai et al. | 252/425.3 |
| 4,762,558 | 8/1988 | German et al. | 75/246 |
| 4,957,543 | 9/1990 | Babjak et al. | 148/537 |
| 4,990,181 | 2/1991 | Pierotti et al. | 75/246 |
| 5,077,257 | 12/1991 | Baldi | 502/301 |
| 5,238,755 | 8/1993 | Van Beignen et al. | 429/40 |
| 5,531,455 | 7/1996 | Sugikawa | 419/2 |
| 5,582,867 | 12/1996 | Tsubouchi et al. | 427/253 |
| 5,672,387 | 9/1997 | Tsubouchi et al. | 427/253 |

FOREIGN PATENT DOCUMENTS

| | | |
|---|---|---|
| 860916 | 1/1971 | Canada . |
| 626188 | 11/1994 | European Pat. Off. . |
| 1257796 | 12/1971 | United Kingdom . |

OTHER PUBLICATIONS

Ban et al., "Development of Porous Metal for Diesel Particulate Filter," Diesel Exhaust Aftertreatment 1995 (SP–1073) pp. 187–93.

Matsunuma et al., "Development of Diesel Particulate Filter Made of Porous Metal" 1996 (SP–1140) pp. 51–56.

*Primary Examiner*—George Wyszomierski
*Attorney, Agent, or Firm*—Edward A. Steen; Blake T. Biederman

[57] ABSTRACT

This process provides a method of fabricating porous aluminide articles. First the process consists of plating a preform with nickel and aluminum to create a metal-plated structure. The plating of nickel consists of electrodeposition or gaseous plating. The plating of aluminum consists of gaseous deposition of an organometallic-aluminum compound. The preform has either an open felt, woven fabric or a reticulated foam shape. Reactive sintering the metal-plated structure leaves an open nickel-aluminum structure having porosity and excellent strength and oxidation properties above 400° C.

17 Claims, 2 Drawing Sheets

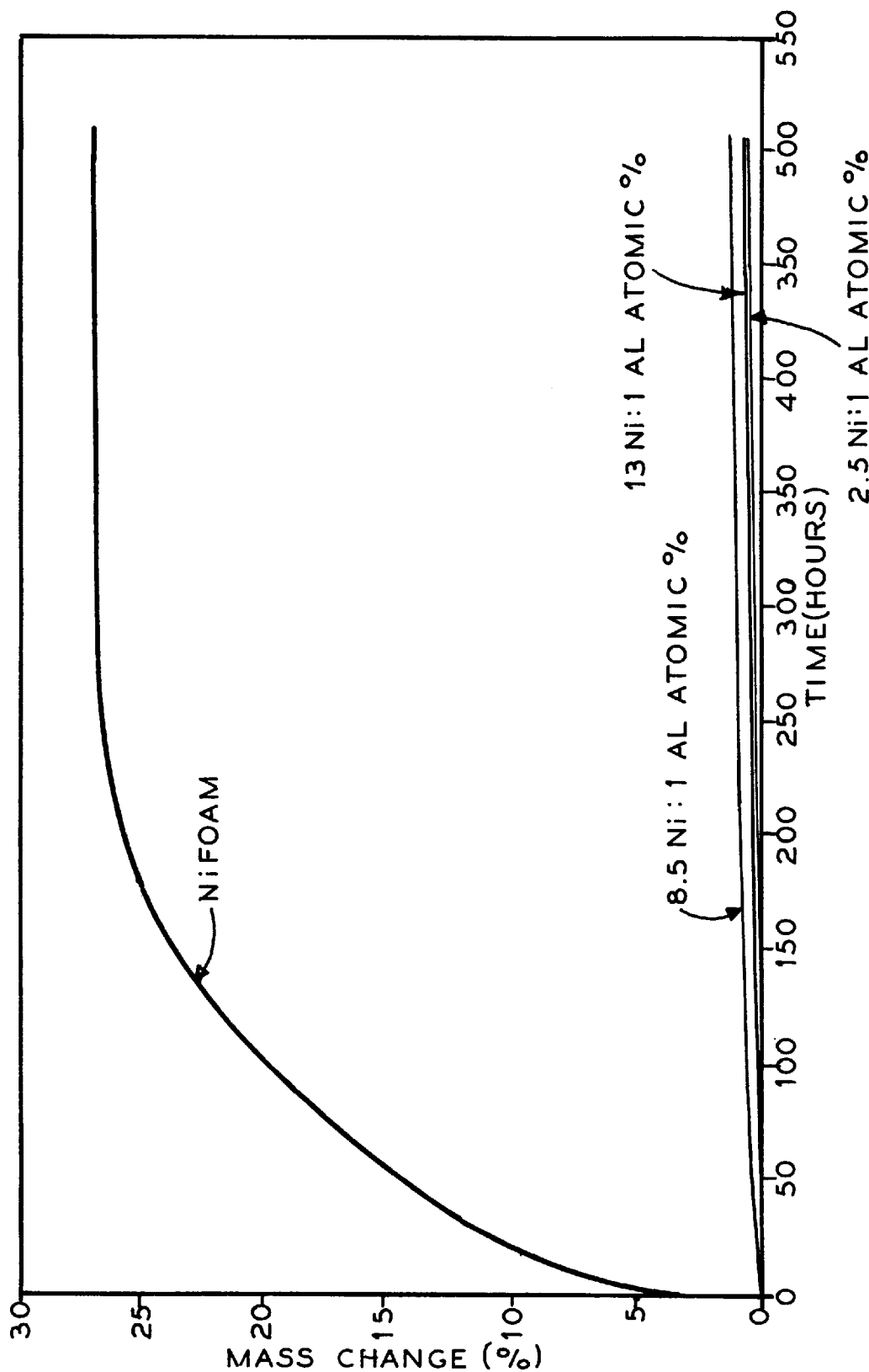

METHOD OF PREPARING POROUS NICKEL-ALUMINUM STRUCTURES

FIELD OF THE INVENTION

This invention relates to the field of porous metal substrates. In particular, this invention relates to a method of forming porous nickel-aluminum structures.

BACKGROUND OF THE INVENTION

Porous aluminide structures have potential applications in a variety of fields. For example, they serve as filter devices at temperatures above 400° C. Furthermore, porous aluminide structures form excellent catalyst supports for cleaning gases in catalytic converters. Furthermore, these structures provide excellent fuel cell anodes. The high temperature strength, oxidation resistance and phase stability of the intermetallic nickel aluminide allow these porous structures to serve in these environments.

Van Beijnen et al., in U.S. Pat. No. 5,238,755, disclose a process for forming a fuel cell from a combination of carbonyl nickel powder (1 to 10 $\mu$m) and intermetallic powder (1 to 10 $\mu$m). This fuel cell structure has very little, if any, porosity. A. L. Baldi, in U.S. Pat. No. 5,077,257, discloses a method of forming porous metal aluminide catalysts from aluminum powder mixed with a powdered pyrophorically activated material (nickel). The process first causes the nickel and aluminum to react. Then it leaches out the aluminum with a solution containing 20% sodium hydroxide to render the remainder a pyrophoric structure. Finally, burning this pyrophoric structure leaves a porous nickel aluminide catalyst.

Pierotti et al., in U.S. Pat. No. 4,990,181, disclose a method of forming porous aluminide structures. This process mixes nickel powder, aluminum powder and cellulose and extrudes them as a green structure. After drying this green structure at 100° C., sintering the dried structure, at 1300° C., in argon atmosphere "burns out" the cellulose and reacts the nickel and aluminum to produce a porous aluminide structure. This process claims the ability to produce aluminide substrates having a porosity between 25 and 75 volume percent from metal powders.

T. Toshiyasu et al., in U.S. Pat. Nos. 5,582,867 and 5,672,387, disclose a method of manufacturing nickel-chromium aluminum foams. This process starts with surrounding nickel foam with powders of aluminum, chromium and $NH_4Cl$ in a chamber containing Ar and $H_2$. Raising and lowering the temperature within the chamber controls the chamber ratio of aluminum to chromium deposited on the nickel product. This pack diffusion process often requires several hours to deposit sufficient chromium and aluminum to form oxidation resistant foams.

It is an object of this invention to provide a method of making high porosity open nickel-aluminum and nickel aluminide structures.

It is a further object of this invention to provide a method of making reinforced porous nickel-aluminum and nickel aluminide structures.

It is a further object of this invention to produce a powder-free method of forming porous nickel-aluminum and nickel aluminide structures.

It is a further object of this invention to provide a method of making porous nickel-aluminum and nickel aluminide structures having controlled porosities.

SUMMARY OF THE INVENTION

This process provides a method of fabricating porous aluminide articles. First the process consists of plating a preform with nickel and aluminum to create a metal-plated structure. The plating of nickel consists of electrodeposition or gaseous plating. The plating of aluminum consists of gaseous deposition of an organometallic-aluminum compound. The preform has either an open felt, woven fabric or a reticulated foam shape. Reactive sintering the metal-plated structure leaves an open nickel-aluminum structure having porosity and excellent strength and oxidation properties above 400° C.

BRIEF DESCRIPTION OF THE DRAWING

FIG. 2 illustrates an improvement in oxidation resistance in air at 600° C. for nickel-aluminum foams, containing an atomic ratio of nickel to aluminum ranging from 13 to 1 to 2.5 to 1, in comparison to pure nickel foams.

DESCRIPTION OF PREFERRED EMBODIMENT

Figure 1:
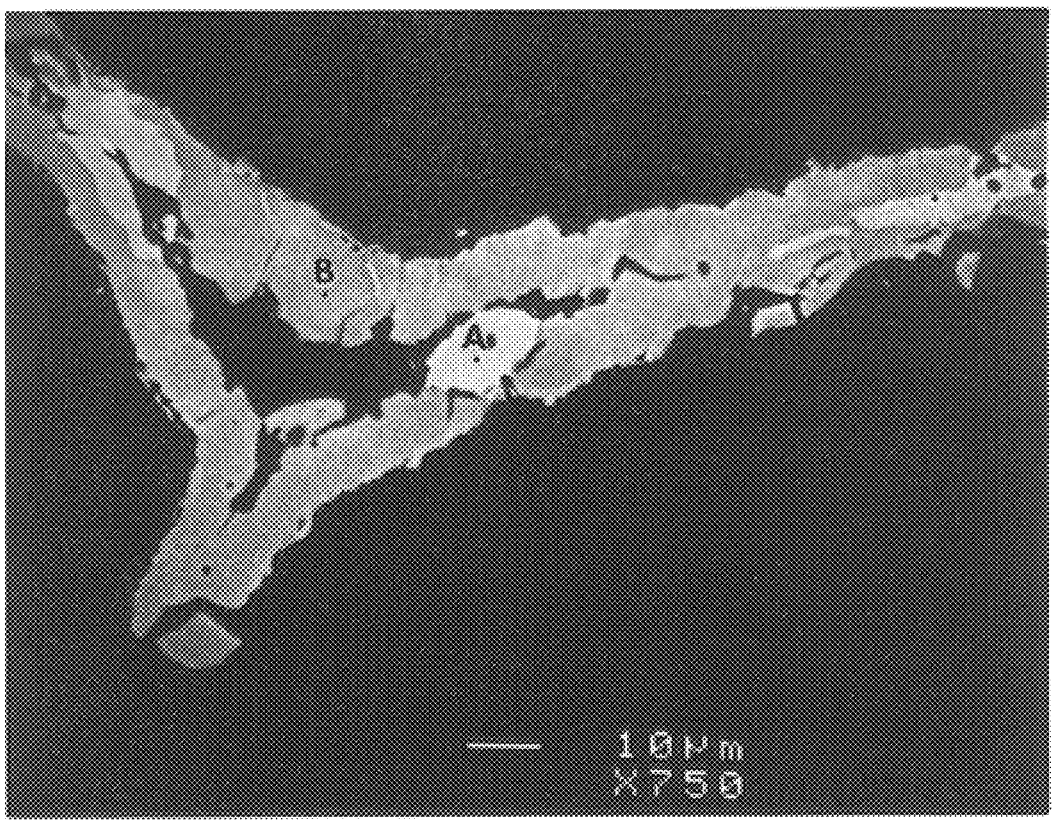
FIG. 1 illustrates a cross section of a nickel aluminide foam at 750X.

The first step of the method consists of coating an open foam, woven fabric or felt preform structure such as reticulated polyurethane, nylon fabric or a fibrous felt material with nickel. These substrate materials typically have a 50 to 97 percent void volume. The substrate material is then pyrolysed and a structurally stable nickel foam, fabric or felt is produced. This article is then over-plated with aluminum and the resulting aluminum-plated nickel article is then reactively sintered to form a porous article containing a nickel-aluminum alloy. These nickel-aluminum alloys are essentially free of detrimental $Al_4C_3$ phase. Furthermore, the resulting article has excellent oxidation resistance at temperatures higher than the original nickel article.

This process advantageously initiates with nickel coating of an open preform structure. It is possible however to coat the preform first with aluminum. When coating unstable organic preforms however, it is most advantageous to coat first with nickel. Coating first with nickel reduces the direct contact between the aluminum and carbon, which reduces or eliminates the $Al_4C_3$ phase.

Optionally heating or sintering the metal-coated preform burns off organic preforms to leave a porous structure. It is often advantageous to sinter the structure before coating it with aluminum to facilitate removal of the carbon and sulfur often contained in the initial coating. Removing the organic preform first provides a thinner barrier for quicker organic removal and prevents the aluminum from reacting with the organic byproducts such as carbon that forms the detrimental $Al_4C_3$ phase.

The preform structure may consist of a reticulated foam structure felt or any combination thereof. Preforms constructed of polymers, carbon, metals, organic materials and ceramics are acceptable. Acceptable substrates include: fibrous natural wool, cotton, cellulose, nylon, polyester, polyurethane, polyisocyanurates, polyphenols, Kevlar and any polymer that does not melt below 180° C. (Kevlar is a trademark of DuPont de Nemours, E.I. & Co.) Some of these polymers thermally decompose on rapid heating to leave high purity nickel foam with minimal shrinkage. The advantages of using polyurethane include quick removal by sintering and low cost. Optionally, using a stable fiber matte as the starting material leaves a fiber reinforced nickel-aluminum matrix. Examples of acceptable reinforcing fibers include SiC, alumina-base, silica-base and alumina-silica-base fibers.

Methods for nickel plating the preform include electroplating, electroless plating and thermal decomposition or chemical vapor deposition (CVD) of nickel. Most advantageously, the nickel plating consists of CVD of nickel carbonyl gas.

This process employs thermal decomposition of an organometallic-aluminum compound, such as the trialkyls of aluminum or the dialkyl aluminum hydrides. To maintain a gaseous compound, the organometallic-aluminum compound advantageously contains between 1 and 4 carbon atoms. The preferred organometallic-aluminum compound consists of triisobutyl-aluminum, triethyl-aluminum, tripropyl-aluminum, diethyl-aluminum hydride, diisobutyl-aluminum hydride and mixtures of these gases. Most advantageously, the method relies upon decomposition of triisobutyl-aluminum gas at temperatures between 100 and 310° C. This process has improved throwing power in comparison to non-aqueous methods. The most advantageous temperature for decomposing the triisobutyl-aluminum gas is at temperatures between 170° C. and 290° C. The thermal decomposing of the aluminum-bearing gas can take less than one hour to coat nickel foam with 50 vol. % aluminum. Most advantageously, the entire aluminum coating occurs in less than ten minutes of decomposing time. Acceptable gas concentrations range from 5 to 100 vol. % triisobutyl-aluminum. During gas decomposition, the chamber typically contains between 20 and 60 vol. % triisobutyl-aluminum gas.

The open nickel-aluminum structure optionally contains 1 to 58 atomic percent aluminum. An addition of 1 to 10 atomic percent aluminum provides a nickel-aluminum solid solution alloy that has significantly improved oxidation resistance at temperatures above 400° C. Depositing an aluminum coating of at least 10 atomic percent of total aluminum and nickel plated forms a nickel aluminide on sintering. Sintering the plated structure in a reducing or an inert atmosphere at a temperature of at least 600° C. rapidly diffuses the aluminum into the nickel to form a uniform structure.

The following detailed description provides an operating example of the process:

EXAMPLE

A sample of pure nickel foam (produced by nickel carbonyl decomposition) was obtained from Inco Limited that was 1.7 mm thick, 500 g Ni/m$^2$ and had an open reticulated structure with a pore size of 100 pores per inch (39 pores per centimeter). Samples of this foam were coated to several levels of aluminum ranging from 1 to 42 atomic % aluminum. The aluminum decomposition consisted of decomposing triisobutyl-aluminum gas vaporized into a mixture of nitrogen and isobutylene gas at a temperature of 200° C. The resulting structure was reactively sintered at 1000° C. for 60 minutes under a vacuum. The resulting structure consisted essentially of a uniform distribution of aluminum in the nickel matrix. For example, the points A & B of FIG. 1 tested to be 27.9 and 28.2 wt. % aluminum respectively, as analyzed by EDS in a SEM.

Samples of these nickel-aluminum and nickel aluminide foams were oxidized in air at 600° C. FIG. 2 shows that the slower oxidation rate of the aluminum containing alloys compared to pure nickel is quite dramatic. The final nickel aluminide products have sufficient strength, ductility and oxidation resistance for use at temperatures of 1000° C. and above. Furthermore, this process has the unique ability to produce nickel-aluminum and aluminide foams with porosities equal to or greater than 98 percent.

The resulting open nickel-aluminum structures are suitable for use as catalyst supports, fuel cell electrodes and baghouse materials for high temperature applications. In all applications the open structure material can be compressed during manufacture to alter porosity. Most advantageously, the process initiates by first coating reticulated polyurethane or a polyester felt with nickel-sintering off the polyurethane and then coating the nickel-coated preform with aluminum. A final sintering step diffuses the aluminum into the nickel structure to form a uniform oxidation resistant structure. Some portion of the aluminum may oxidize while sintering, depending upon the reducing potential of the furnace.

Compressing or rolling before or after the reactive sintering decreases porosity to control the air flow resistance through the material. For large reductions in porosity and for forming nickel aluminide structures, it is most advantageous to roll the nickel-coated preform, porous nickel structure or aluminum-coated nickel structure before the reactive sintering. The resulting nickel-aluminum structures after heat treatment are suitable for metallic bags for hot gas filtration applications.

The process produces nickel-aluminum and nickel aluminide structures with porosities as high as 98 percent. Optionally, this process produces fiber reinforced-porous structures with excellent oxidation resistance. The process also obtains an excellent and uniform distribution of aluminum not relying upon the use of any aluminum powder. Finally, this process may use rolling to achieve a desired porosity from 5 to 98 percent.

In accordance with the provisions of the statute, the specification illustrates and describes specific embodiments of the invention. Those skilled in the art will understand that changes may be made in the form of the invention covered by the claims; and that certain features of the invention may sometimes be used to advantage without a corresponding use of the other features.

We claim:

1. A method of fabricating a porous nickel-aluminum article comprising:
   (a) plating a preform with aluminum and nickel to create a metal-plated structure, said plating of nickel consisting of a coating step selected from the group consisting of electrodeposition and gaseous plating, said plating of aluminum consisting of gaseous deposition of an organometallic-aluminum compound and said preform having a shape selected from the group consisting of an open felt structure, woven fabric and reticulated foam; and
   (b) reactive sintering said metal-plated structure to leave an open nickel-aluminum structure; said open nickel-aluminum structure having porosity.

2. The method of claim 1 including the additional step of removing said preform from said metal-plated structure before said reactive sintering step.

3. The method of claim 1 including the additional step of compressing said metal-plated structure before said reactive sintering to decrease said porosity of said open nickel-aluminum structure formed by said reactive sintering.

4. The method of claim 1 including the additional step of compressing said open nickel-aluminum structure after said reactive sintering to decrease porosity of said open nickel-aluminum structure.

5. The mood of claim 1 wherein said plating of aluminum consists of thermally decomposing an organometallic-aluminum compound selected from the group consisting of trialkyl-aluminum and dialkyl-aluminum-hydrides on said preform plated with nickel; and said organometallic compound contains 1 to 4 carbon atoms.

6. The method of claim 5 wherein said organometallic-aluminum compound is a gas selected from the group consisting of triisobutyl-aluminum, triethyl-aluminum, tripropyl-aluminum, diethyl-aluminum hydride, diisobutyl-aluminum hydride and mixtures of said gases.

7. The method of claim 6 wherein said gas is triisobutyl-aluminum decomposed at a temperature between 100° C. and 310° C.

8. The method of claim 7 wherein said plating includes depositing aluminum from an atmosphere containing 5 to 100 volume percent of said triisobutyl-aluminum.

9. The method of claim 1 wherein said plating includes decomposing nickel carbonyl on said preform to form a nickel-coated preform and decomposing triisobutyl-aluminum on said nickel-coated preform.

10. The method of claim 1 wherein said sintering leaves an open nickel-aluminum structure containing 1 to 58 atomic percent aluminum.

11. The method of claim 1 wherein said plating comprises coating fibers selected from the group consisting of SiC, alumina-base, silica-base and alumina-silica-base fibers, and said reactive sintering forms an open nickel-aluminum structure reinforced with said fibers.

12. A method of fabricating a porous nickel-aluminum article comprising:
   (a) plating an organic preform with nickel to create a nickel-plated structure, said plating of nickel consisting of a coating step selected from the group consisting of electrolytic plating and gaseous plating, said preform having a shape selected from the group consisting of an open felt structure, woven fabric and reticulated foam;
   (b) heating said nickel-plated preform to remove said organic preform and leave a porous nickel structure;
   (c) decomposing an organometallic aluminum on said porous nickel structure to form a porous aluminum-coated nickel structure, said organometallic-aluminum compound being a gas selected from the group consisting of triisobutyl-aluminum, triethyl-aluminum, tripropyl-aluminum, diethyl-aluminum hydride, diisobutyl-aluminum hydride and mixtures of said gases;
   (d) reactive sintering said porous aluminum-coated nickel structure to diffuse aluminum into said nickel structure and react said aluminum with said nickel structure to form an open nickel-aluminum structure having porosity.

13. The method of claim 12 including the additional step of compressing said aluminum-coated nickel structure before said reactive sintering to decrease said porosity of said open nickel-aluminum structure formed by said reactive sintering.

14. The method of claim 12 wherein said decomposing includes depositing aluminum from an atmosphere containing 5 to 100 volume percent triisobutyl-aluminum at a temperature between 100° C. and 310° C.

15. The method of claim 12 wherein said reactive sintering leaves an open nickel-aluminum structure containing 1 to 58 atomic percent aluminum.

16. The method of claim 12 wherein said reactive sintering results in an open nickel-aluminum structure containing nickel aluminide.

17. The method of claim 16 wherein said open nickel-aluminide contains at least 10 atomic percent aluminum.

* * * * *